(12) United States Patent
Takaishi (10) Patent No.: US 6,649,973 B2
(45) Date of Patent: Nov. 18, 2003

(54) SEMICONDUCTOR DEVICE AND METHOD FOR MANUFACTURING THE SAME

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/106,690

(22) Filed: Mar. 27, 2002

(65) Prior Publication Data

US 2002/0142548 A1 Oct. 3, 2002

(30) Foreign Application Priority Data

Mar. 28, 2001 (JP) ......................................... 2001-092163
Apr. 17, 2001 (JP) ......................................... 2001-118455

(51) Int. Cl.$^7$ .......................... H01L 29/76; H01L 29/94
(52) U.S. Cl. ....................... 257/328; 257/330; 438/270; 438/268
(58) Field of Search ................. 438/270, 268, 438/272; 257/328, 330

(56) References Cited

U.S. PATENT DOCUMENTS 4,598,461 A * 7/1986 Love ............................ 29/571
4,898,835 A * 2/1990 Cawlfield .................... 438/324

* cited by examiner

Primary Examiner—Caridad Everhart
(74) Attorney, Agent, or Firm—Rabin & Berdo, P.C.

(57) ABSTRACT

A channel diffusion area (2) for forming a channel region (2a) is placed on a semiconductor layer (1), a source area (3) is formed on this area and a source electrode (7) is formed on the surface of this source area by a metal film. Then, the metal of the source electrode is allowed to spike into the source area and the channel diffusion area to form an alloy layer (7a) with the semiconductor layer, and through this alloy layer, the source electrode is made in ohmic contact with both of the source area and the channel diffusion area. As a result, it is possible to obtain a semiconductor device with an insulated gate-driving element having a construction which makes it possible to minimize the on-resistance by increasing the gate width, using the chip area of the same size, and consequently to provide a greater current.

9 Claims, 9 Drawing Sheets

SEMICONDUCTOR DEVICE AND METHOD FOR MANUFACTURING THE SAME

FIELD OF THE INVENTION

The present invention relates to a power semiconductor device and a manufacturing method thereof, which is provided with a gate-driving element such as a longitudinal MOSFET and an insulated gate bipolar transistor (IGBT) in which a number of transistor cells of a so-called trench structure having a gate electrode formed in a trench formed from the surface of a semiconductor layer. More particularly, the present invention relates to a power gate driving semiconductor device and a manufacturing method thereof, which is allowed to have a reduced on-resistance by increasing the number of transistor cells per unit area so as to provide a great current and can be manufactured through a simple manufacturing process.

BACKGROUND OF THE INVENTION

Figure 7:
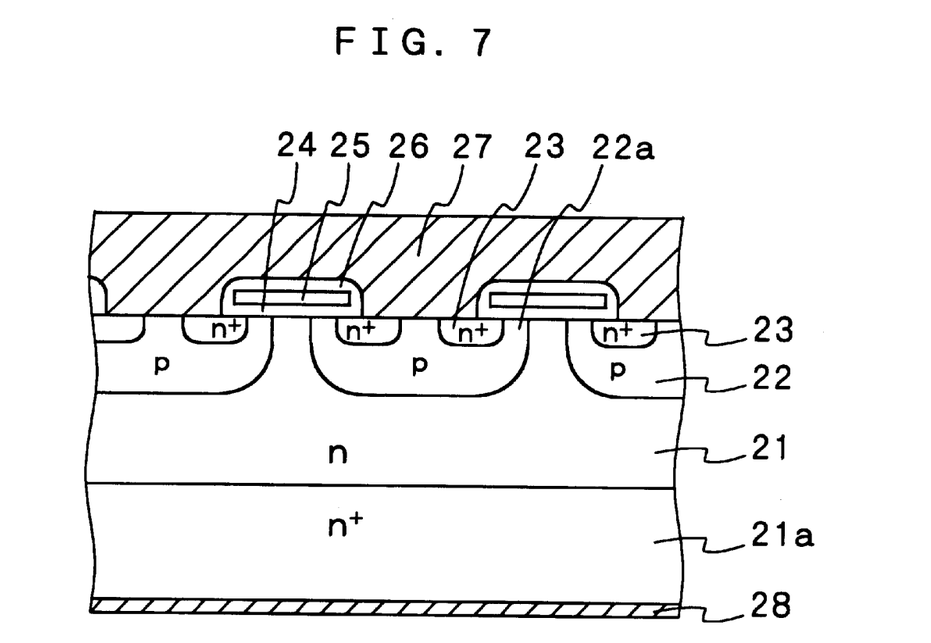
FIG. 7 is a cross-sectional view that explains a construction of a conventional planar-type MOSFET.

Conventionally, with respect to a high-power gate-driving power MOS transistor, a construction in which a great number of transistor cells are formed in parallel with each other to form a matrix format has been adopted so as to provide a greater current. For example, as shown in FIG. 7, a transistor of a planar construction is formed in the following processes: an n-type semiconductor layer (epitaxial growth layer) 21 to be formed into a drain area is epitaxially grown on, for example, an $n^+$-type semiconductor substrate 21a, and p-type impurities are diffused on its surface side so that a p-type body area 22 is formed, and an $n^+$-type source area 23 is formed on the peripheral portion of the body area 22. A gate electrode 25 is formed on the peripheral edge portion of the body area 22 and on the surface side of a semiconductor layer 21 located on the outside thereof through a gate oxide film 24, and a channel region 22a is formed on the peripheral edge portion of the body area. Then, a source electrode (source wiring) 27 is formed to be connected to the source area 23 and the body area 22 by Al, etc., through a contact hole placed in the interlayer insulating film 26, and a drain electrode 28 is formed on the rear face of the semiconductor substrate 21a.

Figure 8:
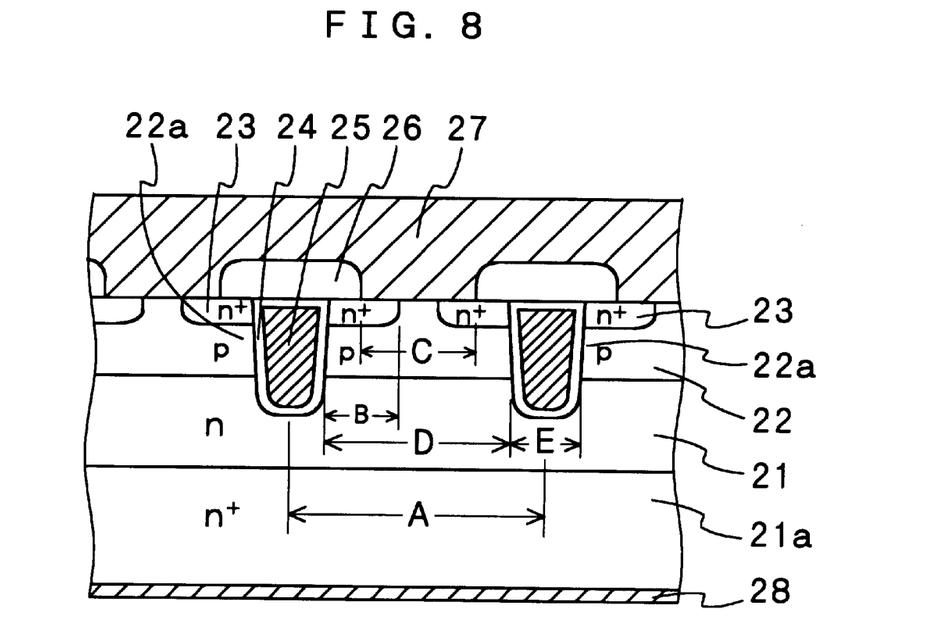
FIG. 8 is a cross-sectional view that explains a structure of a conventional MOSFET of a trench construction.

With respect to a power MOSFET having the trench structure in which gate electrodes are embedded in grooves formed in the semiconductor layer, as shown by an example in FIG. 8, trench are formed in a semiconductor layer 21 in a lattice shape, and after polysilicon to be formed into gate electrodes 25 have been embedded therein, a gate oxide film 24 is formed on the periphery thereof through oxidation, or after the gate oxide film 24 have been formed on the inner surface of the trench, polysilicon to be formed into gate electrodes 25 is embedded therein, so that the gate oxide film 24 and a gate electrode 25 are formed. Then, a p-type channel diffusion area 22 and an $n^+$-type source area 23 are formed around the gate electrode 25, and a channel region 22a is formed in the longitudinal direction. A source electrode 27 is formed so as to make an ohmic contact with the source area 23 and the channel diffusion area 22, and a drain electrode 28 is formed on the rear surface of the semiconductor substrate 21a, in the same manner as FIG. 7.

Here, the planar structure of the gate electrode in these transistors is formed into a desired shape, such as a square, a pentagon or a hexagon. Moreover, in most cases, these transistors are connected to an inductive load such as a motor, and in such a case, when the operation is turned off, an electromotive force tends to be applied thereto in the reverse direction, therefore, in order to prevent the transistor from destruction, as described above, the source electrode 27 is also allowed to contact the channel diffusion area 22 so that a protective diode in the reverse direction is formed between the source and the drain.

In the case of a large-current transistor as described above, it is important to make as many transistors cells as possible in a chip having a fixed size so as to decrease the on-resistance. In order to decrease the on-resistance, it is effective to make the channel width as wide as possible, and in the case of a transistor having the above-mentioned structure, it is preferable to make the total width (the length on the periphery of the gate electrode) of the channel region 22a formed on the periphery of the gate electrode as great as possible.

However, conventionally, in transistors of this type, since the source electrode is made in ohmic-contact with the channel diffusion area on the surface of the semiconductor layer, both of the source area and the channel diffusion area need to be exposed to the surface of the semiconductor layer, and since it is necessary to provide a margin used for a mask-superposing process upon diffusing to form the source area and a margin used for a mask-superposing process between a contact hole and a source area, the size C of the contact hole needs to be set to approximately 2 to 2.5 μm, for example, in the structure shown in FIG. 8, and the cell gap (pitch between the gate electrodes) A is limited to approximately 4.5 to 5 μm. In this case, the width B of the source area is set to approximately 0.8 to 1 μm. For this reason, it is not possible to sufficiently miniaturize the cell and to increase the number of cells, and the resulting problem is that it is not possible to sufficiently reduce the on-resistance.

SUMMARY OF THE INVENTION

The present invention has been devised to solve the above-mentioned problems, and its object is to provide a semiconductor device that is provided with an insulated gate-driving element of a trench construction or a planar-type, which reduces the on-resistance by increasing a gate width even with a chip area of the same size to provide a great current.

Another object of the present invention is to provide a manufacturing method of a semiconductor device which, in the case when there is an element which has the source electrode to be made in contact with both of a channel diffusion area and a source area, makes the source electrode in contact with these with a very small area by using a simple process.

Still another object of the present invention is to provide a manufacturing method of a semiconductor device which makes the source electrode in contact with both of the channel diffusion area and the source area while the pitch of the transistor cells is made very small, by allowing the source electrode to contact in a self alignment without the necessity of a mask alignment margin, and which is obtained by using a very small area through a simple process.

The inventors of the present invention have studied hard to provide a semiconductor device which minimizes the on-resistance of an insulation gate type semiconductor to obtain a great current with a small chip size, and have found that, although when, in general, a metal film such as Al is directly formed on the surface of a semiconductor layer as an electrode, it spikes into the semiconductor layer, resulting in a problem such as short-circuiting, a barrier metal layer is normally interposed in between, but the amount of the metal invading into the semiconductor layer due to the spike can be controlled by controlling conditions such as the thickness of the metal film to be formed and the thermal process, and the spiked alloy layer is sufficiently made in ohmic contact with the semiconductor layer.

Even in the case when the source electrode is made in contact with both of the source area and the channel diffusion area, the source area and the channel diffusion area are formed longitudinally so that the source electrode is allowed to spike into the channel diffusion area of the lower layer to provide superior ohmic contacts in both of the layers.

Moreover, by thickly oxidizing the gate electrode surface of the trench construction to provide an insulating film on the surface without forming a contact hole, even when the metal of the source electrode directly formed on the surface is allowed to spike, it is possible to make the metal in ohmic contact with both of the source area and the channel diffusion area longitudinally formed without causing short-circuiting between the gate electrode and the source electrode. Consequently, although a mask needs to be formed upon forming a trench so as to provide the gate electrode, it is possible to carry out a manufacturing process in a self alignment after the trench has been formed, and consequently to eliminate the margin used for the mask adjustment, thus, it becomes possible to provide a semiconductor device having a very small-size chip, and to greatly simplify the manufacturing process.

A semiconductor device in accordance with the present invention, which is provided with an insulated gate-driving element for controlling a channel region interposed between a source area and a drain area by using an insulated gate electrode includes; a semiconductor layer to form a drain area, a channel diffusion area formed on the semiconductor layer, a source area for interposing a part of the channel diffusion area in cooperation with the drain area, a gate electrode that is placed on a channel region which is the part of the channel diffusion through a gate oxide film, a source electrode formed so as to be electrically connected to the source area and channel diffusion area, and a drain electrode formed so as to be electrically connected to the drain area, wherein the source area is formed so that at least a part of the source area places on the channel diffusion area, and the source electrode is formed on a surface of the source area by a metal film, a metal of the source electrode being allowed to spike into the source area and the channel diffusion area to form an alloy layer with the source area and the channel diffusion area, thereby the source electrode being made in ohmic contacts with both of the source area and the channel diffusion area through the alloy layer.

With this arrangement, it becomes possible to eliminate the necessity of a masking process for diffusing the source area, and the alignment margin is required only when a contact hole is formed, and is not required so much. Further, it is not necessary to form contact areas to both of the source area and the channel diffusion area on the surface of the semiconductor layer, and it is only necessary to expose only the source area to the surface, therefore, it is possible to greatly miniaturize the contact hole. Consequently, the pitch of the gate electrodes is greatly narrowed and the number of cells is increased greatly, consequently, it is possible to provide a high-power semiconductor device which has a widened gate electrode, minimizes the on-resistance and provides a greater current.

More specifically, the above-mentioned insulated gate-driving element may be a device having a trench construction in which the gate electrode is formed in the trench of the semiconductor layer and the channel diffusion area and the source area are formed in a longitudinal direction around the trench or a planar-type element in which the gate electrode is formed on the surface of the semiconductor layer through a gate oxide film.

Moreover, with respect to the semiconductor layer, in addition to silicon, silicon carbide, etc. may be used, and in the case of the source electrode made of aluminum, this is readily allowed to form an alloy with silicon or silicon carbide, thereby making it possible to easily form an alloy layer through spiking.

With respect to a specific construction of a gate-driving semiconductor device of the trench construction, it is provided with a trench formed in a first conductivity type semiconductor layer, a gate oxide film formed on the surface inside the trench, a gate electrode embedded into the above-mentioned trench, a second conductivity type channel diffusion area formed on the surface of the semiconductor layer around the gate electrode, a first conductivity type source area further formed on the surface of the channel diffusion area, an insulating film that is thickly formed through oxidation of the gate electrode on the surface side of the gate electrode, a source electrode made of a metal directly formed on the surface of the insulating film and the surface of the source area, an alloy layer that is formed by allowing the metal of the source electrode to spike into the source area and the channel diffusion area, and a drain electrode that is electrically connected to the semiconductor layer.

With this arrangement, the insulating film is thickly formed on the surface side of the gate electrode through oxidation of the gate electrode, therefore, even when an insulating film is not formed on the surface to form a contact hole that exposes the source area, and a source electrode being directly formed on the surface of the semiconductor layer generates spikes through a thermal treatment, no short-circuiting is caused to the gate electrode.

In other words, it is not necessary to form a contact hole by forming an insulating film on the surface of the semiconductor layer, therefore, the source area and the source electrode are formed through self alignment by forming only the gate electrode. Consequently, the margin for a mask alignment is no longer necessary, the pitch (interval) of the transistor cells can be narrowed greatly, and the number of transistor cells per unit area is increased, thus, it becomes possible to reduce the on-resistance, and consequently to provide a high-power MOSFET having a great current.

The gate electrode and the insulating film are formed in such a manner that the surface side of the gate electrode is engraved deeper than the surface of the semiconductor layer, the insulating film is formed through oxidation of the gate electrode with the surface of the insulating film being set virtually in the same level as the surface of the source area, thus, the surface is flattened, the source electrode (source wiring) is also flattened, and the source electrode (Al) is flattened, and uniformed so that it becomes possible to provide a stable spiking process.

The manufacturing method of a semiconductor device in accordance with the present invention includes the steps of; (a) forming a trench in a first conductivity type semiconductor layer serving as a drain area, and forming a gate electrode in the trench through a gate oxide film, (b) successively diffusing a second conductivity type impurity and a first conductivity type impurity on the semiconductor layer so that a channel diffusion area and a source area are formed in a longitudinal direction, (c) forming a source electrode made of a metal on the surface of the source area, (d) carrying out a thermal process to allow the metal of the source electrode to spike into the source area and the channel diffusion area so that an alloy layer for allowing the source electrode to be made in ohmic contact with the source area and the channel diffusion area is formed, and (e) forming a drain electrode that is electrically connected to the first conductivity type semiconductor layer. Here, the order of these respective processes is not particularly limited, and, for example, steps (a) and (b) may be carried out reversely.

This method makes it possible to form the channel diffusion area and the source area completely in the longitudinal direction, and consequently to form a gate-driving semiconductor device of a trench construction with a very small area.

When the formation of the source electrode is carried out after having formed a contact hole in an insulating film formed on the surface of the semiconductor layer in a separate position from the gate oxide film, the channel region is preferably made less susceptible to erosion by the alloy layer.

In another aspect of the manufacturing method of a semiconductor device in accordance with the present invention that relates to a manufacturing method of a gate-driving semiconductor device of a planar type, it includes the steps of (a') forming a gate electrode on the surface of a first conductivity type semiconductor layer serving as a drain area, (b') successively diffusing a second conductivity type impurity and a first conductivity type impurity on the semiconductor layer around the gate electrode so that a channel diffusion area and a source area are formed so as to form a channel region under the gate electrode, (c) forming a source electrode made of a metal on the surface of the source area, (d) carrying out a thermal process to allow the metal of the source electrode to spike into the source area and the channel diffusion area so that an alloy layer for allowing the source electrode to be made in ohmic contact with the source area and the channel diffusion area is formed, and (e) forming a drain electrode that is electrically connected to the first conductivity type semiconductor layer.

With this method also, it is not necessary to expose the channel diffusion area to the surface of the semiconductor layer so as to make the channel diffusion area in contact with the source electrode, thus, it is possible to greatly minimize the cell pitch, to widen the gate width by increasing the number of cells, and consequently to provide a great current.

In still another aspect of the manufacturing method of a semiconductor device in accordance with the present invention, it includes the steps of (a) forming a trench in a first conductivity type semiconductor layer serving as a drain area, and forming a gate electrode in the trench through a gate oxide film, (b") successively diffusing a second conductivity type impurity and a first conductivity type impurity on the semiconductor layer in any one of the steps so that a channel diffusion area and a source area are formed in a longitudinal direction around the gate electrode, (f) forming a thick insulating film by oxidizing the surface of the gate electrode, as well as exposing the surface of the source area, (c') forming a source electrode made of a metal on the surface of the insulating film formed on the exposed surface of the source area and the gate electrode, (d) carrying out a thermal process to allow the metal of the source electrode to spike into the source area and the channel diffusion area so that an alloy layer for allowing the source electrode to be made in ohmic contact with the source area and the channel diffusion area is formed, and (e) forming a drain electrode that is electrically connected to the first conductivity type semiconductor layer.

With this arrangement, it is not necessary to form a contact hole by forming an insulating film on the surface of the semiconductor layer and the source electrode is formed through self alignment, therefore, the gap of the transistor cells can be narrowed greatly and the on-resistance can be reduced, thereby making it possible to greatly simplify the manufacturing process, and also to manufacture the device at low costs.

Prior to the formation of the insulating film on the surface side of the gate electrode, the surface of the gate electrode is engraved deeper than the surface of the semiconductor layer through etching so that the insulating film is formed so as to set the surface of the insulating film formed through the step (f) virtually in the same level as the surface of the source area exposed through the step (f), thus, the surface is flattened although it still has a trench structure, and it becomes possible to provide a semiconductor device having a power MOSFET with a flat surface.

In another method, prior to the formation of the insulating film on the surface side of the gate electrode, an oxidation preventive film is formed on the surface of the semiconductor layer around the gate electrode so as to oxidize only the surface of the gate electrode, thus, it becomes possible to form a thick oxidized film only on the gate electrode by oxidizing only the surface of the gate electrode without the necessity of an etch back process using RIE, etc.

DETAILED DESCRIPTION

Figure 1A:
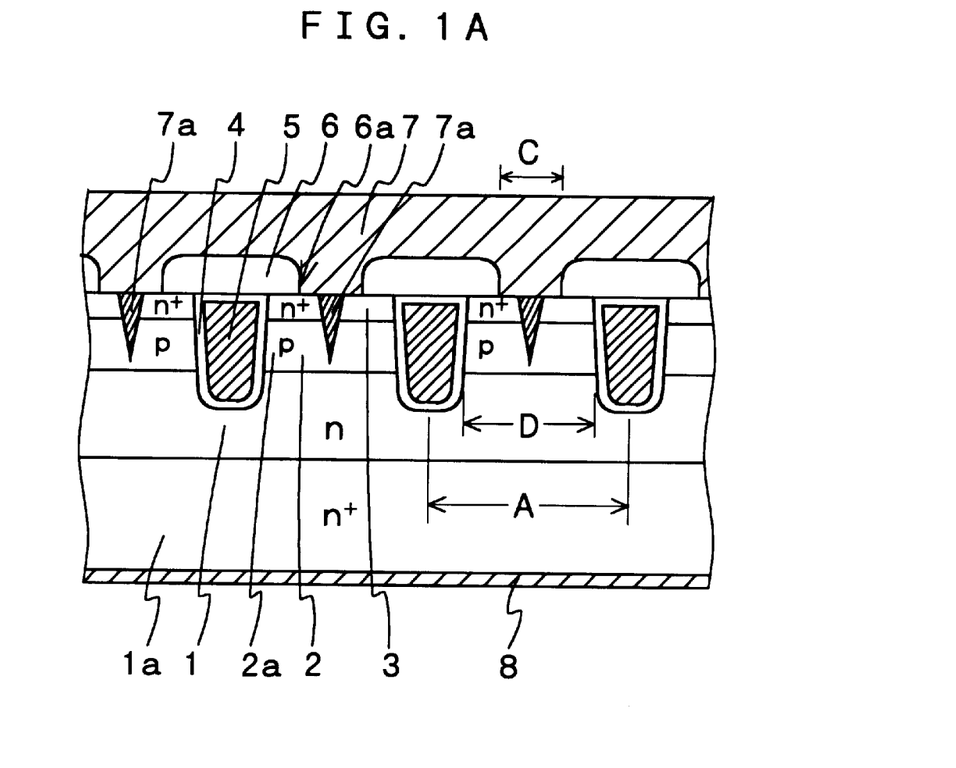
FIGS. 1A and 1B are explanatory drawings that show a cross-sectional view and a plan view of a trench MOSFET that is one embodiment of a semiconductor device of the present invention.

As shown in FIG. 1 that is a cross-sectional view that explains one portion of an MOSFET having a gate electrode of a trench construction in accordance with one embodiment, a semiconductor device of the present invention has an arrangement in which a channel diffusion area 2 forming a channel region 2a is placed on a semiconductor layer 1, and on this is formed a source area 3 and on the surface of the source area 3 is formed a source electrode 7 made of a metal film. Further, the metal of the source electrode 7 is allowed to spike into the source area 3 and the channel diffusion area 2 to form an alloy layer 7a with the semiconductor layer, and the source electrode 7 is made in ohmic contact with both of the source area 3 and the channel diffusion area 2 through the alloy layer 7a. Here, in the following Figures including this Figure, a semiconductor substrate 1a and a drain electrode 8 are indicated as portions thinner than the other portions, and these do not show a correct thickness relationship as a whole.

The semiconductor layer 1 is an n-type semiconductor layer made of silicon that is formed on an n$^+$-type semiconductor substrate 1a that is made of, for example, silicon and has a great concentration in impurities, through epitaxial growth with a thickness of several $\mu$ms to several tens of $\mu$ms, for example, approximately 5 $\mu$m, and p-type impurities made of boron, etc. are diffused on its surface, and n-type impurities made of phosphor, etc. are further diffused thereon so that a p-type channel diffusion area 2 is formed thereon with a thickness of approximately 1 $\mu$m and an n$^+$-type source area 3 is formed thereon with a thickness of approximately 0.3 $\mu$m.

Figure 1B:
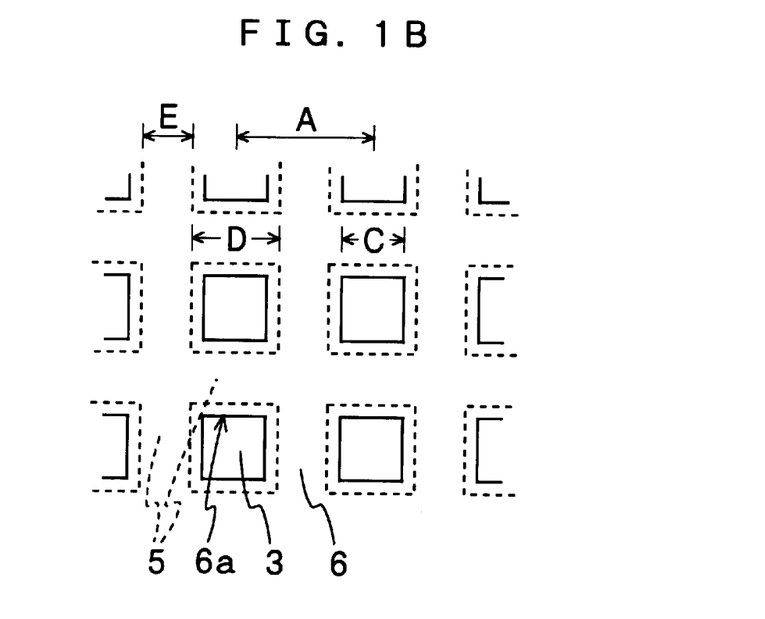

As shown in a plan view of FIG. 1(b) that explains a state before the source electrode has been formed, the trench is formed in a lattice format with distances (A) of a pitch of approximately 2 $\mu$m, a width (E) of approximately 0.5 $\mu$m and a depth of approximately 1.5 $\mu$m, and a gate electrode 5 made of polysilicon, etc. is formed inside the trench through the gate oxide film 4. An insulating film 6, made of SiO$_2$, etc., is formed on the entire surface of the semiconductor layer, a contact hole 6a is formed so as to expose the source area 3, and a metal film, made of Al, etc., is formed on the surface thereof with a thickness of approximately 3 $\mu$m so as to provide a source electrode 7.

This construction is subjected to a thermal process at approximately 400° C. for approximately 30 minutes so that Si is diffused in Al in cooperation with interaction exerted on the interface between the source electrode 7 and the source electrode 3, thus, an alloy layer of Al and Si is allowed to progress into the semiconductor layer so that an alloy layer 7a having a sharp top is formed as shown in FIG. 1(a). This alloy layer 7a has a varied spike depth inside thereof depending on the temperature and time of the thermal process, and is formed in a manner so as to intrude into the channel diffusion area 2 and so as not to penetrate through the channel diffusion area 2.

In other words, as described earlier, the inventors of the present invention have studied hard to provide a semiconductor device which minimizes the on-resistance of an insulated gate semiconductor to obtain a great current with a small chip size, and it was found that the amount of intrusion into the semiconductor layer of a metal film formed on the surface of a semiconductor layer is controlled by adjusting the thickness of a metal film to be formed and the conditions of the thermal process, and as shown in FIG. 1(a), that the source electrode 7 is made in ohmic contact only with the source area 3 and the channel diffusion area 2 without allowing it to penetrate through the channel diffusion area 2.

The depth of this alloy layer, that is, the depth of the so-called spike becomes deeper by increasing the temperature of the thermal process or extending the time of the thermal process, and is controlled with high precision. In the case when, for example, an Al film is formed on Si, the spike starts at approximately 300° C., and the process is more efficiently carried out at approximately 400° C. with the depth of the spike being controlled with high precision.

For example, the thermal process is carried out, for example, at approximately 400° C. for 30 minutes so that the spike is made with a depth of approximately 0.6 to 0.8 $\mu$m, thus, in the case of the source area 3 with a depth of approximately 0.3 $\mu$m and the channel diffusion area 2 with a diffusion depth of approximate 1 $\mu$m, when the alloy-forming process is carried out under these conditions, it is possible to eliminate the possibility of the spike penetrating the channel diffusion area 2, while the metal layer is made in ohmic contact with both of the layers. Consequently, as described earlier, an overlapping portion in the longitudinal direction is formed between the channel diffusion area 2 and the source area 3, and by allowing a metal such as Al to spike into the surface thereof, the metal is made in ohmic contact with both of the areas.

Moreover, it has been found that, when the size of the contact hole is set to not more than approximately 1 $\mu$m on one side, one spike is allowed to intrude almost entirely, and that, when the size of the contact hole is set to approximately 10 $\mu$m that is larger than the above-mentioned hole, the spike is not formed uniformly as a whole, but formed in a separated manner into many branches.

With the construction shown in FIG. 1, it is only necessary to take the overlapping margin between the mask for forming the contact hole 6a and the mask for forming the trench into consideration, and it is only necessary for the contact hole of the semiconductor layer surface to allow contact to the source area, with the result that it becomes possible to make the cell pitch very small.

For example, the size of the contact hole is set to approximately 1 $\mu$m, and the cell pitch A is set to 1.5 to 2 $\mu$m. In the example shown in FIG. 1, in order to avoid short-circuiting between the source electrode 7 and the gate electrode 5 and to prevent the channel region 2a from erosion by the alloy layer, an insulating film 6 such as SiO$_2$ is formed on the surface of the semiconductor layer including the surface of the gate electrode 5, and the contact hole is formed in a manner so as to separate from the gate oxide film 4 so that the source electrode 7 is formed, however, the upper portion of the gate electrode 5 is sufficiently oxidized to form an oxide film so that, without forming the insulating film 6, that is, without forming the contact hole, the source electrode 7 can be formed. Thus, it can be made as small as a minimum size of the mask precision, that is, for example, D=0.4 $\mu$m, E=approximately 0.3 $\mu$m and A=approximately 0.7 $\mu$m.

For example, in a conventional structure in which the width E (see FIG. 1(b)) of the gate oxide film 4 on the periphery of the gate electrode 5 is set to 0.5 $\mu$m with the interval D of adjacent gate oxide films 4 being set to 4.5 $\mu$m (the cell pitch A being set to 5 $\mu$m), when D is narrowed to 2 $\mu$m with the same size of E by using the present invention, it is possible to cut the pitch A of the transistor cells in half from 5 $\mu$m to 2.5 $\mu$m, and consequently to increase the number of cells to 4 times per unit area. Here, the length on the periphery of the gate oxide film that serves as the gate width that gives effects on the on-resistance is set to 2/4.5×4 (the number of cells per unit area)=1.78, thereby making it possible to set the resistance to 1/1.78 as well as increasing the current to 1.78 times. In the same manner, when D is set to 1.5 $\mu$m, 1 $\mu$m and 0.5 $\mu$m respectively, the current can be increased to 2.08 times, 2.47 times and 2.78 times, respectively.

In the precision of the current exposing technique of the fine processing by the use of, for example, i-rays, it is possible to achieve approximately 0.35 $\mu$m, therefore, the application of this technique makes it possible to not only set D to 0.35 $\mu$m, but also to set the width E of the gate electrode to approximately 0.35 μm so that it becomes possible to further increase the number of cells per unit area and consequently to provide a greater current.

Figure 2A:
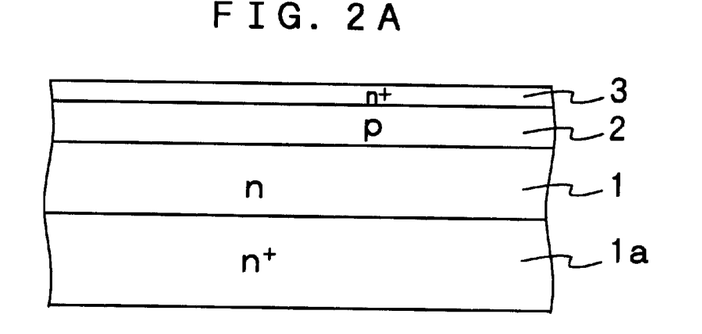
FIGS. 2A to 2D are cross-sectional explanatory drawings that show manufacturing processes of the MOSFET shown in FIG. 1.

Referring to FIGS. 2A to 2D, the following description will discuss a manufacturing method of this MOSFET of a trench construction. First, as shown in FIG. 2A, an n-type semiconductor layer 1 is formed on an n⁺-type semiconductor substrate 1a with a thickness of approximately 5 μm through epitaxial growth. Then, p-type impurities such as boron are diffused on its surface to form a p-type channel diffusion area 2, and n-type impurities such as phosphor are then diffused thereon to form an n⁺-type source area 3.

Figure 2B:
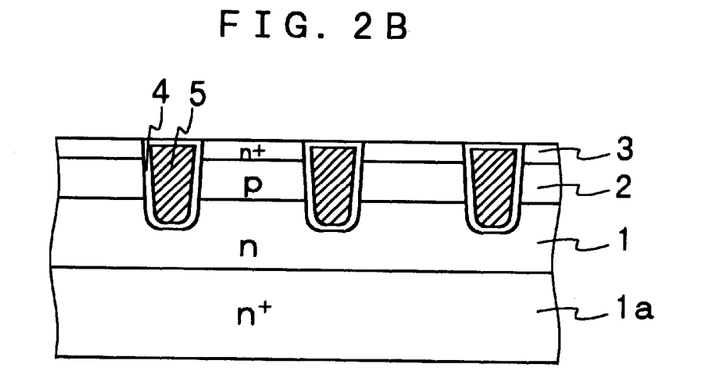

Thereafter, a resist film, which has lattice-shaped openings as shown in a gate electrode pattern of FIG. 1B, is formed on the entire surface of a semiconductor layer, and the trench having a depth of approximately 1.5 μm is formed thereon through dry etching such as RIE. Thereafter, the resist film is removed, polysilicon is deposited on the entire surface, and the polysilicon film on the surface is removed through etch back, etc. This is then subjected to a thermal process at approximately 900° C. for 30 minutes, thus, as shown in FIG. 2B, a gate electrode 5 and a gate oxide film 4 having a thickness of approximately 0.05 μm are formed in the trench.

Figure 2C:
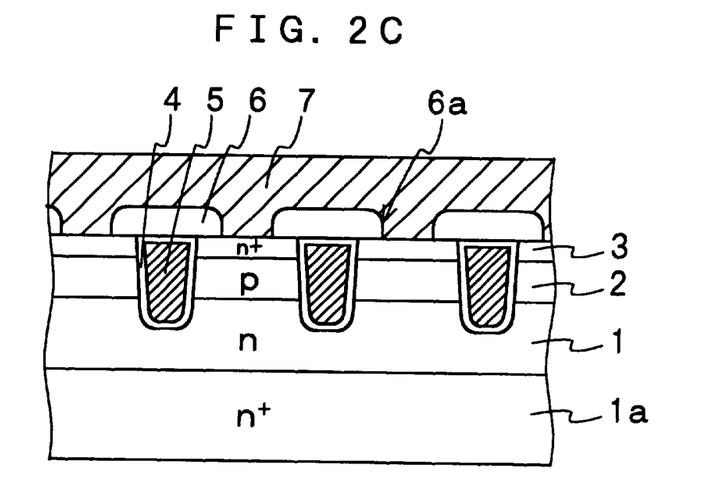

Next, as shown in FIG. 2C, an insulating film 6 such as $SiO_2$ is formed on the surface of the semiconductor layer through a CVD method, etc., with a thickness of 0.5 μm to cover the gate electrode 5, and an opening 6a is formed so as to expose the source area 3 around the gate electrode 5. Then, a metal film such as Al is formed on the entire surface thereof through a sputtering method with a thickness of approximately 3 μm so that a source electrode 7 is formed.

Figure 2D:
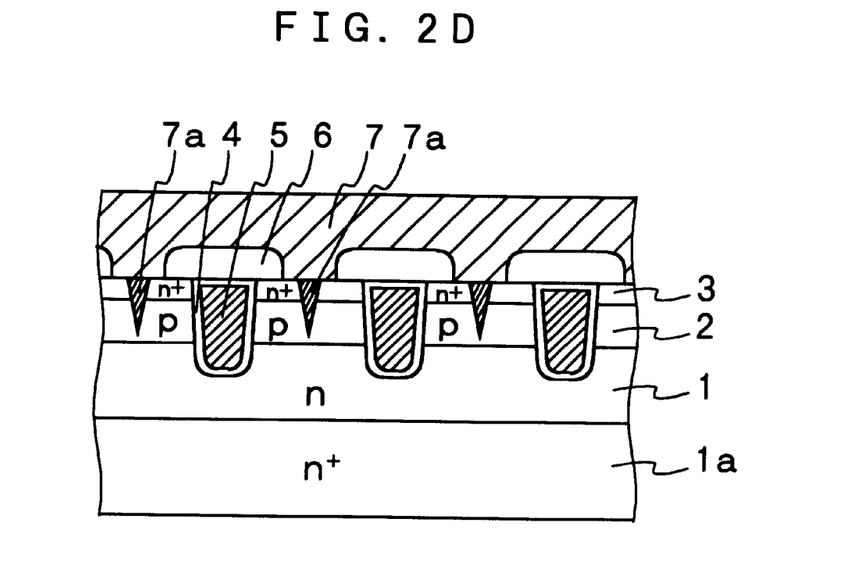

Then, under a nitrogen ($N_2$) atmosphere, this is subjected to a thermal process at approximately 400° C. for approximately 30 minutes so that, as shown in FIG. 2D, the metal material of the source electrode 7 forms an alloy with Si of the semiconductor layer to spike into the source area 3 and the channel diffusion area 2 to form an alloy layer 7a. In this case, as described earlier, since the depth of the spike defers depending on the temperature and the time of this thermal process, the conditions of the thermal process need to be controlled so as to allow this to intrude into the channel diffusion area 2 to provide an ohmic contact, and so as not to penetrate the channel diffusion area 2 to reach the semiconductor layer 1. Thereafter, a metal film made of Ti, etc. is formed on the rear face of the semiconductor substrate 1a by sputtering to form a drain electrode 8, thereby making it possible to provide an MOSFET having a trench construction as shown in FIG. 1A.

Here, in the example shown in FIGS. 2A to 2D, after having carried out the diffusion for the channel diffusion area 2 and the source area 3, the trench is formed to provide the gate electrode 5, however, after having formed the semiconductor layer 1 through epitaxial growth, the gate electrode 5 may be formed, and the diffusion for the channel diffusion area 2 and the source area 3 may be carried out.

Figure 3:
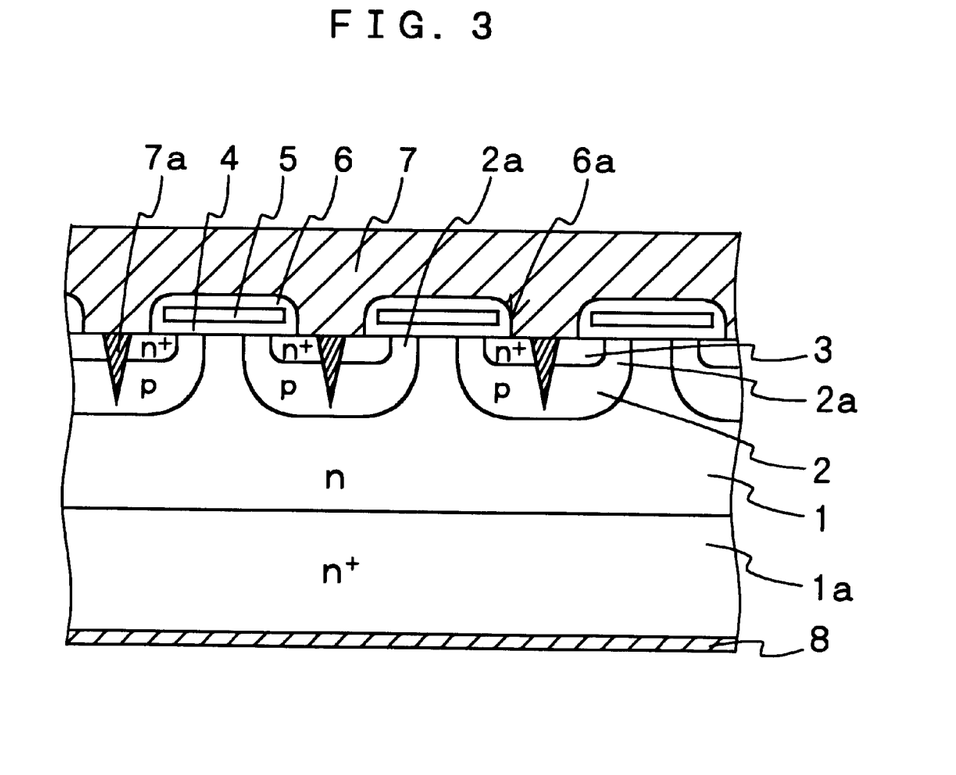
FIG. 3 is a cross-sectional explanatory drawing that shows an example of a semiconductor device of a planar type in accordance with the present invention.

In the above-mentioned example, the MOSFET of a trench construction has been shown, and FIG. 3 shows an MOSFET of a planar type. In order to obtain this MOSFET of a planar type, in the same manner as the example described above, an n-type semiconductor layer 1 is formed on an n⁺-type semiconductor substrate 1a through epitaxial growth, and a gate electrode 5 is formed on the surface thereof through a gate oxide film 4. Then, p-type impurities are diffused using the gate electrode 5 as a mask, and n-type impurities are then diffused, thus, the impurities, first diffused, are again diffused in the succeeding diffusion in an isotropic manner so that, as shown in FIG. 3, the channel diffusion area 2 is further diffused below the gate electrode 5, thereby forming a channel region 2a below the gate electrode 5 with a gap portion to the source area 3.

Further, in the same manner as the example described above, an insulating film 6 is formed on the entire surface thereof so that an opening 6a for exposing the source area 3 is formed so as to provide a source electrode 7. Moreover, by carrying out the same thermal process as described above, an alloy metal layer 7a which is allowed to spike to provide ohmic contacts to the channel diffusion area 2 and the source area 3 is formed, and a drain electrode 8 is formed on the rear face of the semiconductor substrate 1a, thus, it is possible to provide an MOSFET of a planar type shown in FIG. 3.

Figure 4A:
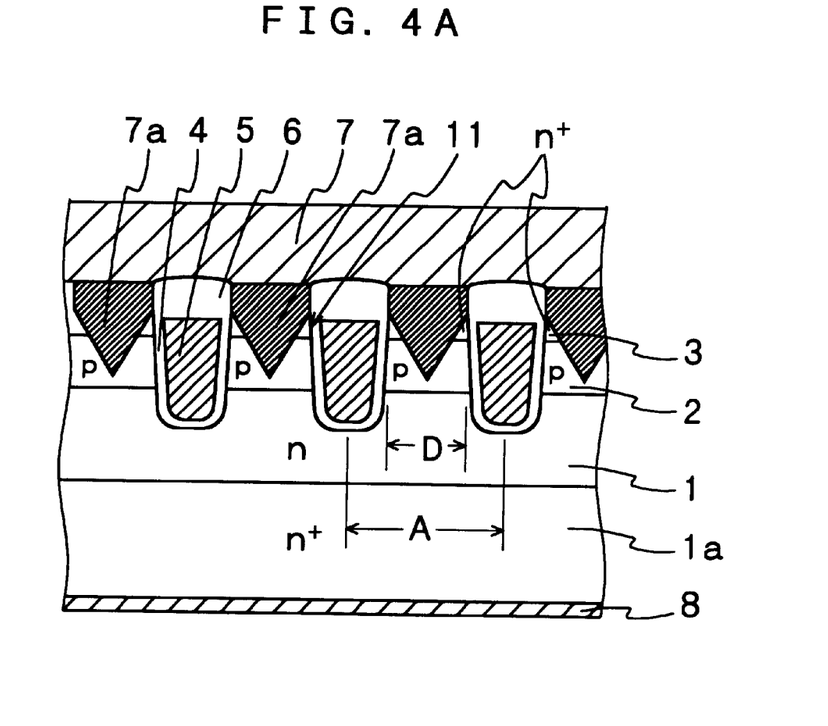
FIGS. 4A and 4B are explanatory drawings that show a cross-sectional view and a plan view of a semiconductor device that is another embodiment of a semiconductor device of the present invention.
Figure 4B:
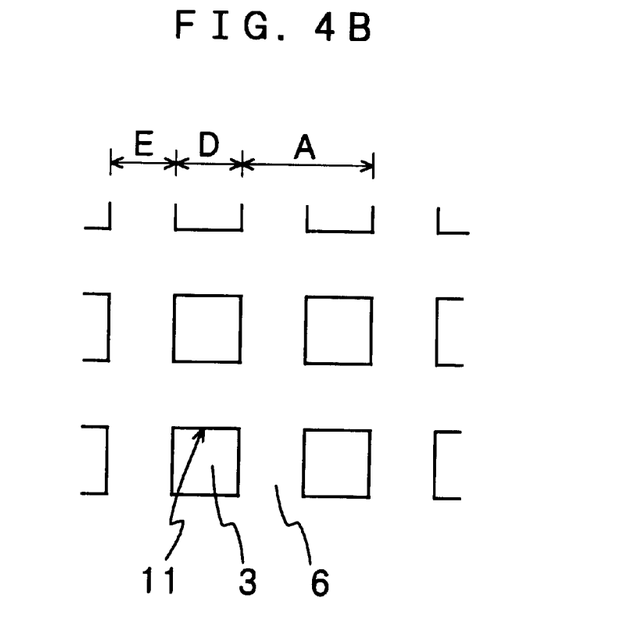

FIGS. 4A and 4B show an example in which the aforementioned semiconductor device having a trench construction is further miniaturized. FIGS. 4A and 4B, which are the same explanatory drawings as FIGS. 1A and 1B, show an arrangement in which the trench 11 is formed in a first conductivity type (for example, n-type) semiconductor layer 1, and a gate oxide film 4 is formed on the inner surface of the trench 11, and a gate electrode 5, made of polysilicon, etc., is embedded inside the trench 11. Moreover, a second conductivity type (for example, p-type) channel diffusion area 2 is formed on the surface of the semiconductor layer 1 around the gate electrode 5, and an n-type source area 3 is further formed on the surface of the channel diffusion area 2 through diffusion, etc. An insulating film 6 is thickly formed on the surface side of the gate electrode 5 by oxidizing the gate electrode so as to obtain a sufficient voltage resistance.

Moreover, a metal film is directly formed on the surface of the insulating film 6 and the surface of the source area 3 so that a source electrode 7 is formed. The metal of this source electrode 7 is allowed to spike into the source area 3 and the channel diffusion area 2 to form an alloy layer 7a and also a drain electrode 8 is provided on a rear surface of the semiconductor substrate 1a so as to be electrically connected to the semiconductor layer 1 in ohmic contacts.

The semiconductor layer 1 and so on are the same as those shown in the example shown in the aforementioned FIG. 1A, and in this example, the p-type channel diffusion area 2 is set to have a thickness of approximately 1 μm and the n⁺-type source area 3 is set to have a thickness of approximately 0.5 μm. Further, the lattice-shaped trench 11 is formed so as to have an interval (A) of approximately 0.7 to 2.0 μm, a width (E) of approximately 0.2 to 1 μm and a depth of approximately 1.5 μm.

As will be described later, for example, an etch back process is carried out after polysilicon has been deposited on the entire surface so as to remove the polysilicon film from the portions other than the inside of the trench 11 so that the gate electrode 5 is formed only the inside of the trench 11. In this case, the etch back process is further carried out so that the semiconductor layer (source area 3) is etched and engraved to a depth of approximately 0.1 to 0.3 μm from the surface (the surface of the source area 3, covered with the oxide film, is not etched).

Then, a thermal process is carried out so that since polysilicon is more susceptible to oxidation than monocrystal silicon, the exposed portion on the surface of the gate electrode 5 is particularly oxidized to form a thick oxide film 6 on the surface thereof, thus, the etch back process is further carried out on the entire surface to expose the surface of the source area 3 so that the source area 3 and the insulating film 6 are formed on virtually the same surface. Then, a metal film, made of Al, etc., to serve as a source electrode 7, is formed on the surface thereof with a thickness of approximately 3 μm in the same manner as the aforementioned example. In the same manner as the aforementioned example, the metal of this source electrode 7 is allowed to spike through a thermal process to provide ohmic contacts to the source area 3 and the channel region 2.

With the construction as shown in FIGS. 4A and 4B, although a mask is required only when the trench is formed, it is not necessary to form masks based upon the trench 11 in the succeeding processes, and the source area 3 and the source electrode 7 are formed through self alignment. Consequently, the gate electrode width E and the interval D can be made as small as a minimum size of the mask precision, for example, D=0.4 μm and E=approximately 0.3 μm, that is, the cell pitch A=approximately 0.7 μm.

For example, in a conventional structure shown in FIG. 8 in which the width E of the gate oxide film 4 on the periphery of the gate electrode 5 is set to 0.5 μm with the interval D of adjacent gate oxide films 4 being set to 4.5 μm (the cell pitch A being set to 5 μm), when D is narrowed to 1 μm with the same size of E by using the present embodiment as shown in FIG. 4A, it is possible to set the pitch A of the transistor cells to 1.5 μm, and consequently to increase the number of cells to $(5/1.5)2=11.1$ times per unit area. Here, the length on the periphery of the gate oxide film that serves as the gate width that gives effects on the on-resistance is set to 1/4.5 (the rate of reduction of the length of the periphery of the gate electrode (4D))×11.1 (the number of cells per unit area)=2.47, thereby making it possible to set the resistance to 1/2.47 as well as setting the current to 2.47 times.

In the same manner, when D is set to 0.5 μm, the current can be increased to 2.78 times. In the precision of the current exposing technique of the fine processing by the use of, for example, i-rays, it is possible to achieve approximately 0.35 μm, therefore, the application of this technique makes it possible to not only set D to 0.35 μm, but also to set the width of E of the gate electrode to approximately 0.35 μm (A=0.7) so that the number of cells is set to $(5/0.7)^2=51$ times, and the current is set to (0.35/4.5)×51=4 times.

Figure 5A:
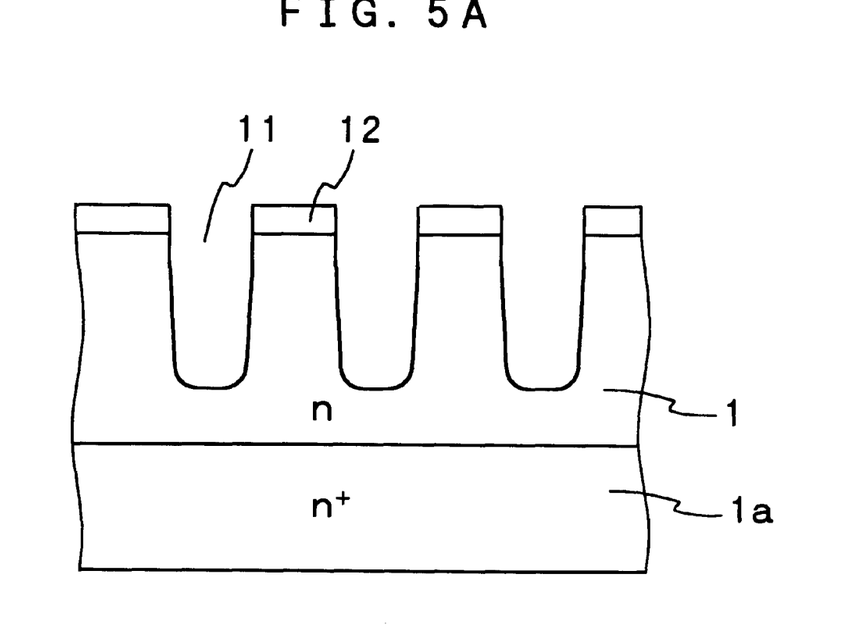
FIGS. 5A to 5E are cross-sectional explanatory drawings that show manufacturing processes of the MOSFET shown in FIG. 4A.

Next, referring to FIGS. 5A to 5E, the following description will discuss a manufacturing method of this MOSFET of a trench construction. First, as shown in FIG. 5A, an n-type semiconductor layer 1 is formed on an n$^+$-type semiconductor substrate 1a with a thickness of approximately 5 μm through epitaxial growth. Then, an SiO$_2$ film 12 is formed on the surface thereof with a thickness of approximately 0.5 μm through a CVD method or the like, and patterned so as to expose formation places of gate electrodes in a lattice form. Further, the trench 11 having a depth of approximately 1.5 μm is formed through dry etching such as RIE.

Figure 5B:
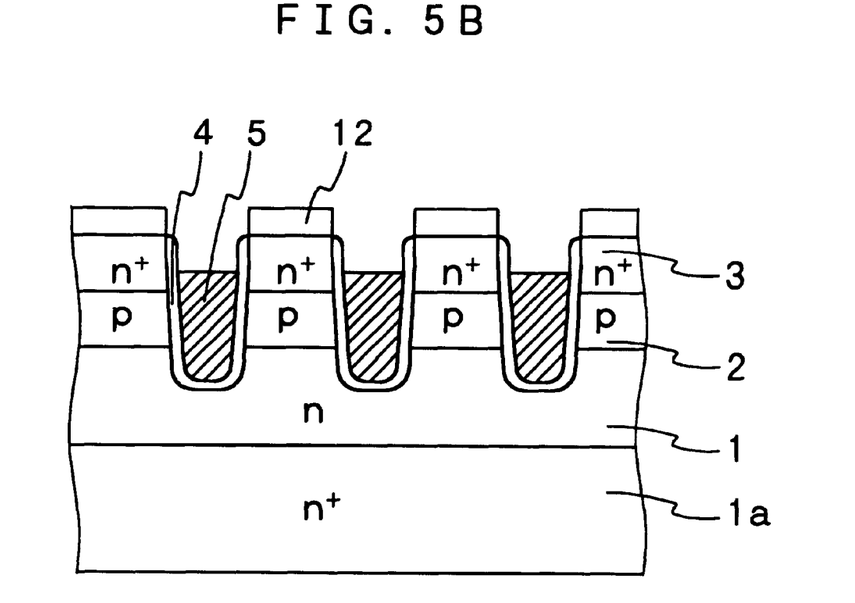

Thereafter, as shown in FIG. 5B, this is then subjected to a thermal process at approximately 900 to 1000° C. for 30 minutes under a vapor atmosphere so that a gate oxide film 4 is formed on the inner surface of the trench 11. Then, polysilicon is deposited on the entire surface so that polysilicon is embedded inside the trench. Thereafter, an etch back process is carried out by an RIE method so that the polysilicon film deposited on the surface other than the trench 11 is etched and removed. In this case, when all the polysilicon film other than the inside of the trench 11 is etched, an oxide film 12 is exposed so that the etching process is stopped.

Here, the polysilicon inside the trench 11, which is to form the gate electrode 5, is continuously etched so that only the polysilicon film inside of the trench 11 is further engraved. The etching process is further carried out until the depth of the engraved pit has reached approximately 0.1 to 0.3 μm from the surface of the semiconductor layer. The reason that the semiconductor layer is etched deeper than the surface thereof is because provision is made to form an insulating film on the gate electrode 5 through self alignment.

Thereafter, the oxide film 12 on the surface is removed through etching, and p-type impurities made of boron, etc. are diffused on its surface to form a p-type channel diffusion area 2, and n-type impurities made of phosphor, etc. are further diffused thereon to form an n$^+$-type source area 3. The respective diffusing processes are carried out such that the depth of this channel diffusion area 2 is set to approximately 0.7 to 1 μm from the surface, with the depth of the source area 3 being set to approximately 0.3 to 0.5 μm.

Figure 5C:
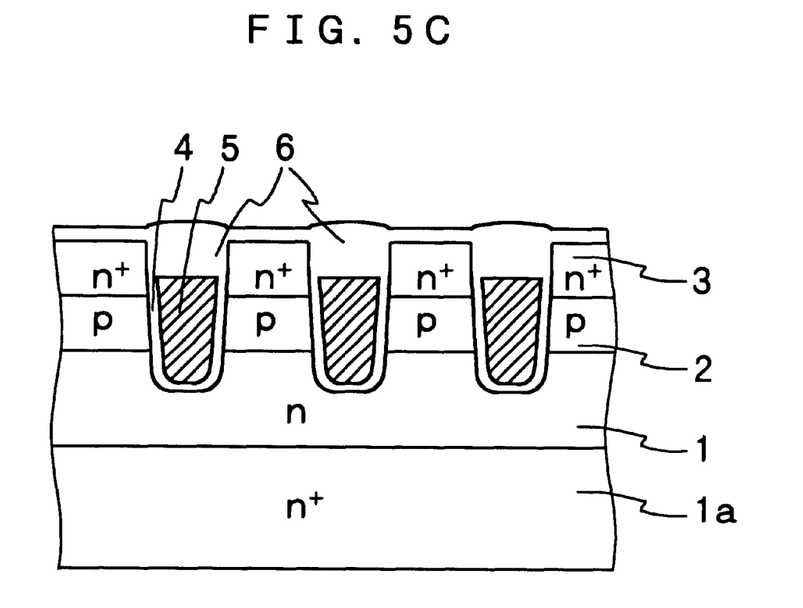

Next, this is subjected to a thermal process at approximately 900° C. for 30 minutes under a vapor atmosphere, and since polysilicon is easily susceptible to oxidation while mono-crystal silicon is hardly oxidized, oxidation takes place only on the surface of the gate electrode 5 so that as shown in FIG. 5C, an oxide film 6 is formed in the engraved portion inside the trench 11.

Figure 5D:
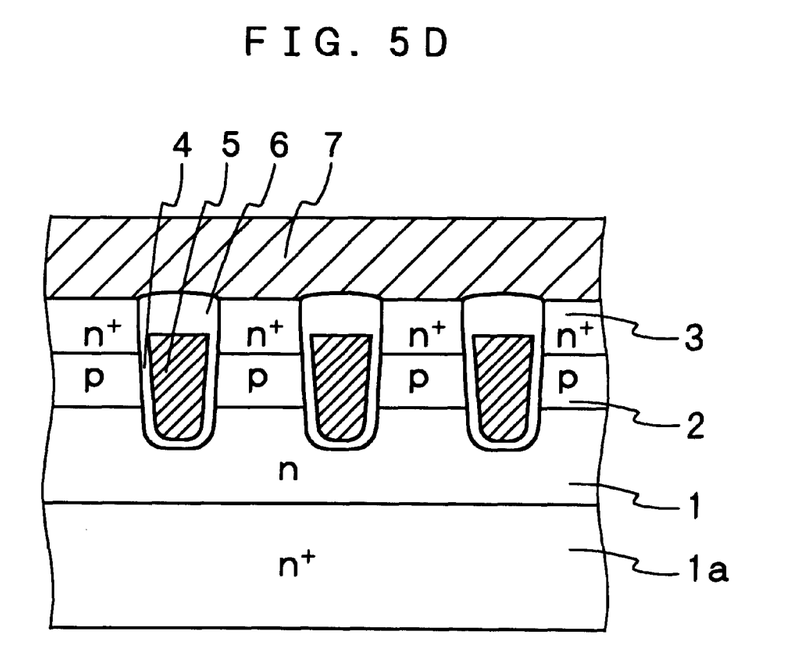

Then, an etch back process is carried out on the entire surface by RIE method so that the insulating film 6 on the oxide film 12 and the gate electrode 5 on the surface is etched so as to expose the source area 3. Consequently, the surface of the source area 3 thus exposed and the surface of the insulating film 6 on the gate electrode 5 are formed as virtually flat faces. Then, Al is deposited on the entire surface with a thickness of approximately 3 μm by using, for example, a sputtering method so that a source electrode 7 is formed as shown in FIG. 5D.

Figure 5E:
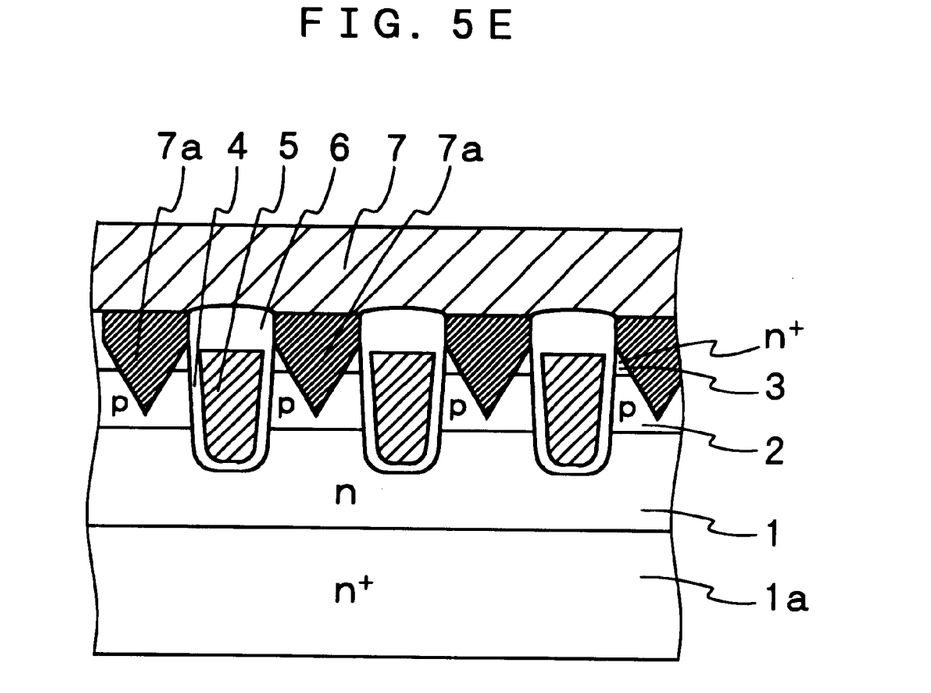

Next, under the same conditions as the aforementioned example, the metal material of the source electrode 7 is allowed to spike so that the construction as shown in FIG. 5E is formed. Here, in the examples shown in FIGS. 5A and 5B, after the gate oxide film 4 and the gate electrode 5 have been formed after the formation of the trench 11, diffusing processes for the channel diffusion area 2 and the source area 3 are carried out, however, after the channel diffusion area 2 and the source area 3 have been formed on the entire surface after the formation of the semiconductor layer 1 through epitaxial growth, the trench 11 may be formed, and the gate electrode 5, etc. may be formed, or prior to the formation of the source electrode 7 in the process shown in FIG. 5D, the channel diffusion area 2 and the source area 3 may be formed.

FIGS. 6A to 6D are cross-sectional views that explain still another manufacturing method in the same manner. In this example, an oxidation preventive film such as silicon nitride is formed on portions other than the gate electrodes, and oxidized thereon so that an insulating film is thickly formed on the surface of the gate electrode.

Figure 6A:
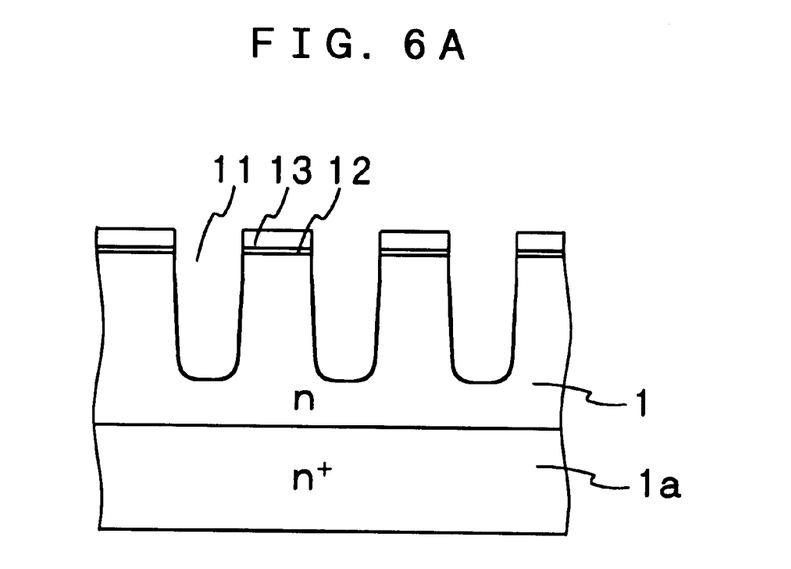
FIGS. 6A to 6D are cross-sectional explanatory drawings that show manufacturing processes of an another method of the MOSFET shown in FIG. 4A.

First, as shown in FIG. 6A, in the same manner as the aforementioned example, an n-type semiconductor layer 1 is formed on an n$^+$-type semiconductor substrate 1a with a thickness of approximately 5 μm through epitaxial growth, an SiO$_2$ film 12 is formed thereon by oxidizing the surface thereof with a thickness of 0.02 μm, and an Si$_3$N$_4$ film 13 serving as an oxidation preventive film is successively formed by using a reduced-pressure CVD method or the like with a thickness of 0.2 μm, thus, this is subjected to a patterning process to expose the formation places of the gate electrodes in a lattice form. A trench 11, having a depth of 1.5 μm, is formed by a dry etching process such as RIE. The SiO$_2$ film 12 is formed so as to alleviate stress.

Figure 6B:
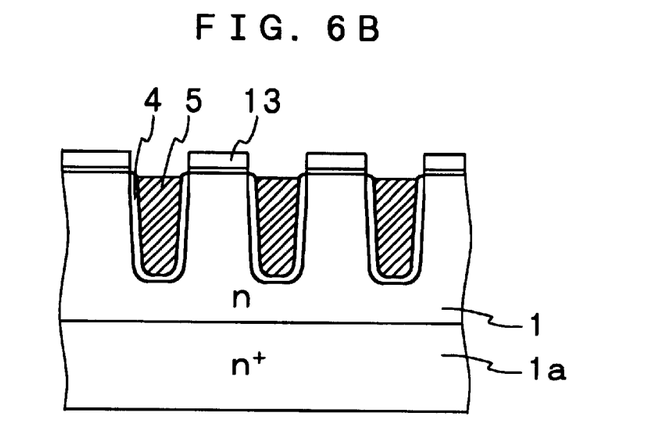

Thereafter, in the same manner as the aforementioned FIG. 5B, a gate oxide film 4 is formed on the inner surface of the trench 11, and polysilicon is deposited on the entire surface, and an etch back process is carried out through an RIE method, and polysilicon is embedded into the trench, thereby forming a gate electrode 5 (FIG. 6B).

Figure 6C:
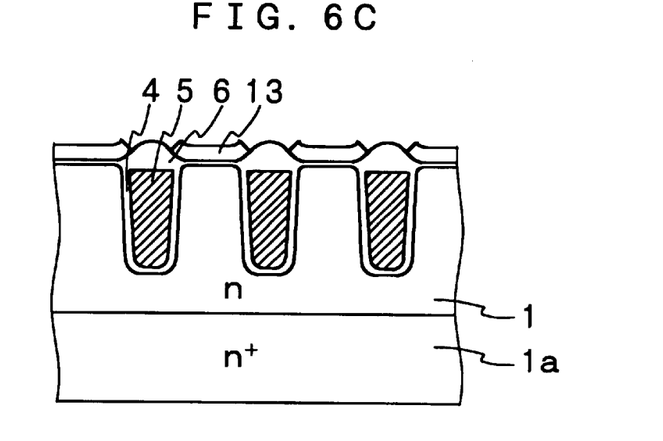
Figure 6D:
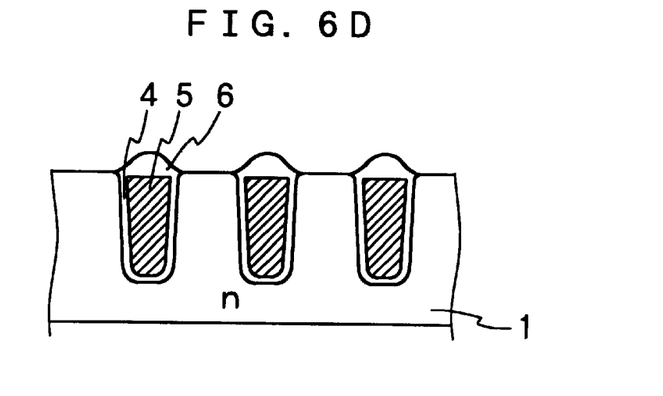

Next, this is subjected to a thermal process at a temperature of approximately 900° C. for approximately 30 minutes under a vapor atmosphere so that a portion below the Si$_3$N$_4$ film 13 is not oxidized, but the surface of exposed polysilicon is oxidized, thus, as shown in FIG. 6C, a thick oxide film 6 is formed on the surface of the gate electrode 5. Then, the Si$_3$N$_4$ film 13 and the SiO$_2$ film 12 are respectively removed through etching so that as shown in FIG. 6D, a construction in which a thick oxide film 6 is formed on the gate electrode 5 with the semiconductor layer 1 exposed around the gate electrode 5.

Thereafter, p-type impurities such as boron are diffused to form a p-type channel diffusion area 2, and n-type impurities such as phosphor are then diffused thereon to form an n$^+$-type source area 3, and Al is deposited on the entire surface with a thickness of approximately 3 μm by using, for example, a sputtering method so that a source electrode 7 is formed to provide the same construction as shown in FIG. 5D. Thereafter, Al is allowed to spike in the same manner as described above so that a semiconductor device having the same construction as shown in FIG. 4A is obtained.

Without the necessity of an etch back process such as RIE, the application of this method makes it possible to form a contact to a source electrode through a self alignment while a thick oxide film is formed on the surface of the gate electrode. As a result, it is possible to provide a semiconductor device which can increase the gate width so that a great current is provided with a small on-resistance, without causing damages to the semiconductor layer.

In the above-mentioned respective examples, silicon is used as the semiconductor substrate 1a and the growing semiconductor layer. However, SiC may be used to further reduce the series resistance and consequently to reduce the on-resistance so that this method is more suitable for providing a great current.

Moreover, the aforementioned embodiments have exemplified a longitudinal MOSFET, however, the same effects may be obtained when applied to an insulated gate bi-polar transistor (IGBT) in which a bi-polar transistor is incorporated into this longitudinal MOSFET.

In accordance with the first embodiment of the present invention, in order to obtain ohmic contacts for both of the channel diffusion area and the source area of an MOSFET, a source electrode is formed on the surface of a portion formed in a manner so as to superpose the channel diffusion area and the source area in a longitudinal direction, and the metal material is allowed to spike into the channel diffusion area of the lower layer so as to provide ohmic contacts, therefore, it is possible to provide contacts to both of the areas by using a very small area. Consequently, it is possible to increase the number of transistor cells per unit area, to reduce the on-resistance to not more than ½, and consequently to increase the current to not less than two times in the same operation voltage.

Moreover, in accordance with the second embodiment of the present invention, in an MOSFET of a trench construction, although a mask is formed when trench is formed, no mask needs to be formed in the following processes, and a channel diffusion area, a source area and ohmic contacts of the source electrode to the source area and the channel diffusion area are obtained through self alignment, therefore, it is possible to greatly simplify the manufacturing process, to eliminate the margin for mask alignment, and consequently to miniaturize the transistor cells to the mask precision at which the trench is formed. As a result, it becomes possible to greatly increase the number of transistor cells per unit area, to provide a great current by reducing the on-resistance, and consequently to improve the performance of a power gate-driving transistor.

Although preferred examples have been described in some detail it is to be understood that certain changes can be made by those skilled in the art without departing from the spirit and scope of the invention as defined by the appended claims.

What is claimed is:

1. A semiconductor device comprising:
    a semiconductor layer of a first conductivity type having a trench;
    a gate oxide film formed on the surface inside said trench;
    a gate electrode embedded into said trench;
    a channel diffusion area of a second conductivity type formed on the surface of said semiconductor layer around said gate electrode;
    a source area of said first conductivity type further formed on the surface of said channel diffusion area;
    an insulating film formed on the surface side of said gate electrode;
    a source electrode made of a metal directly formed on the surface of said insulating film and the surface of said source area;
    an alloy layer that is formed by allowing said metal of said source electrode to spike into said source area an channel diffusion area; and
    a drain electrode that is formed so as to be electrically connected to said semiconductor layer.

2. The semiconductor device according to claim 1, wherein said semiconductor layer is made of a silicon or a silicon carbide and said source electrode is made of an aluminum.

3. The semiconductor device according to claim 1, wherein said insulating film is thickly formed through oxidation of said gate electrode.

4. The semiconductor device according to claim 3 wherein said gate electrode and said insulating film are formed in such a manner that the surface side of said gate electrode is engraved deeper than the surface of said semiconductor layer, the insulating film is formed through oxidation of said gate electrode with said surface of the insulating film being set virtually in the same level as said surface of said source area.

5. A method for manufacturing a semiconductor device comprising the steps of:
    (a) forming a trench in a first conductivity type semiconductor layer serving as a drain area, and forming a gate electrode and a gate oxide film;
    (b) forming, in any one of the steps, a channel diffusion area and a source area in a longitudinal direction;
    (c) forming a source electrode made of a metal on the surface of said source area;
    (d) carrying out a thermal process to allow said metal of said source electrode to spike into said source area and said channel diffusion area so that an alloy layer for allowing said source electrode to be made in ohmic contact with said source area and said channel diffusion area is formed, and (e) forming a drain elect ode that is electrically connected to said semiconductor layer.

6. The method for manufacturing a semiconductor device according to claim 5, wherein the formation of said source electrode is carried out after having formed a contact hole in an insulating film formed on the surface of said semiconductor layer in a separate position from said gate oxide film.

7. A method for manufacturing a semiconductor device comprising the steps of:

(a) forming a trench in a first conductivity type semiconductor layer serving as a drain area, and forming a gate electrode and a gate oxide film in said trench;

(b") forming, in any one of the steps, a channel diffusion area and a source area in a longitudinal direction around said gate electrode;

(f) forming a thick insulating film by oxidizing the surface of said gate electrode, as well as exposing the surface of said source area;

(c') forming a source electrode made of a metal on the surface of said insulating film formed on said gate electrode and the exposed surface of said source area;

(d) carrying out a thermal process to allow said metal of said source electrode to spike into said source area and said channel diffusion area so that an alloy layer for allowing said source electrode to be made in ohmic contact with said source area and said channel diffusion area is formed, and (e) forming a drain electrode that is electrically connected to said semiconductor layer.

8. The method according to claim 7, wherein prior to the formation of said insulating film on the surface side of said gate electrode, the surface of said gate electrode is engraved deeper than the surface of said semiconductor layer through etching so that said insulating film is formed so as to set the surface of said insulating film formed through said step (f) virtually in the same level as the surface of said source area exposed through said step (f).

9. The method according to claim 7, wherein prior to the formation of said insulating film on the surface side of said gate electrode, an oxidation preventive film is formed on the surface of said semiconductor layer around said gate electrode so as to oxidize only the surface of said gate electrode.

* * * * *